United States Patent
Mori

(10) Patent No.: US 8,760,627 B2
(45) Date of Patent: Jun. 24, 2014

(54) LITHOGRAPHIC APPARATUS AND METHOD OF MANUFACTURING ARTICLE

(75) Inventor: Kenichiro Mori, Utsunomiya (JP)

(73) Assignee: Canon Kabushiki Kaisha, Tokyo (JP)

(*) Notice: Subject to any disclaimer, the term of this patent is extended or adjusted under 35 U.S.C. 154(b) by 343 days.

(21) Appl. No.: 13/093,309

(22) Filed: Apr. 25, 2011

(65) Prior Publication Data

US 2011/0267595 A1 Nov. 3, 2011

(30) Foreign Application Priority Data

Apr. 28, 2010 (JP) ................. 2010-104232

(51) Int. Cl.
  G03B 27/32 (2006.01)
  G03B 27/42 (2006.01)
  G03B 27/54 (2006.01)
  G03B 27/72 (2006.01)
  G03F 7/20 (2006.01)

(52) U.S. Cl.
  CPC ........ *G03F 7/70066* (2013.01); *G03F 7/70091* (2013.01)
  USPC ................... 355/71; 355/53; 355/67; 355/77

(58) Field of Classification Search
  CPC .... G03F 7/70; G03F 7/70066; G03F 7/70091
  USPC ............... 355/53, 67, 71, 77; 430/5
  See application file for complete search history.

(56) References Cited

U.S. PATENT DOCUMENTS

| | | | |
|---|---|---|---|
| 6,680,774 B1 | 1/2004 | Heinle | |
| 8,531,649 B2 * | 9/2013 | Hirano et al. | 355/71 |
| 8,625,073 B2 * | 1/2014 | Hirano et al. | 355/53 |
| 2003/0017401 A1 | 1/2003 | Kawata et al. | |
| 2005/0212156 A1 | 9/2005 | Tokita et al. | |
| 2008/0297748 A1 * | 12/2008 | Smeets et al. | 355/53 |
| 2010/0178612 A1 * | 7/2010 | Onvlee et al. | 430/311 |

FOREIGN PATENT DOCUMENTS

| | | |
|---|---|---|
| CN | 1508631 | 6/2004 |
| CN | 101178547 A | 5/2008 |
| EP | 1582923 A2 | 10/2005 |
| JP | 2-51254 B2 | 11/1990 |
| JP | 2005-045160 A | 2/2005 |
| JP | 2005-286062 A | 10/2005 |
| TW | 200421015 A | 10/2004 |

OTHER PUBLICATIONS

Machine Translation of JP 2005-045160.*

(Continued)

*Primary Examiner* — Toan Ton
*Assistant Examiner* — Colin Kreutzer
(74) *Attorney, Agent, or Firm* — Rossi, Kimms & McDowell LLP.

(57) ABSTRACT

A lithographic apparatus includes: a light-shielding plate which includes, on an edge thereof, an arc overlapping with a circular boundary line that defines a region onto which the pattern is transferred and is located inside an outer periphery of a substrate, and blocks the light to prevent the light from being incident on an outer peripheral region located outside the circular boundary line; a first driving unit which rotates the light-shielding plate about an axis parallel to an optical axis of the irradiation system; and a second driving unit which linearly drives the light-shielding plate within a plane perpendicular to the optical axis.

11 Claims, 7 Drawing Sheets

(56) References Cited

OTHER PUBLICATIONS

Japanese Office Action for corresponding JP 2010-104232, mail date Jul. 13, 2012.

CN Office Action issued Mar. 18, 2013 for corres. CN201110103590.7.

Taiwanese Office Action cited in Taiwan counterpart application No. TW100111009, dated Aug. 6, 2013. English translation provided.

* cited by examiner

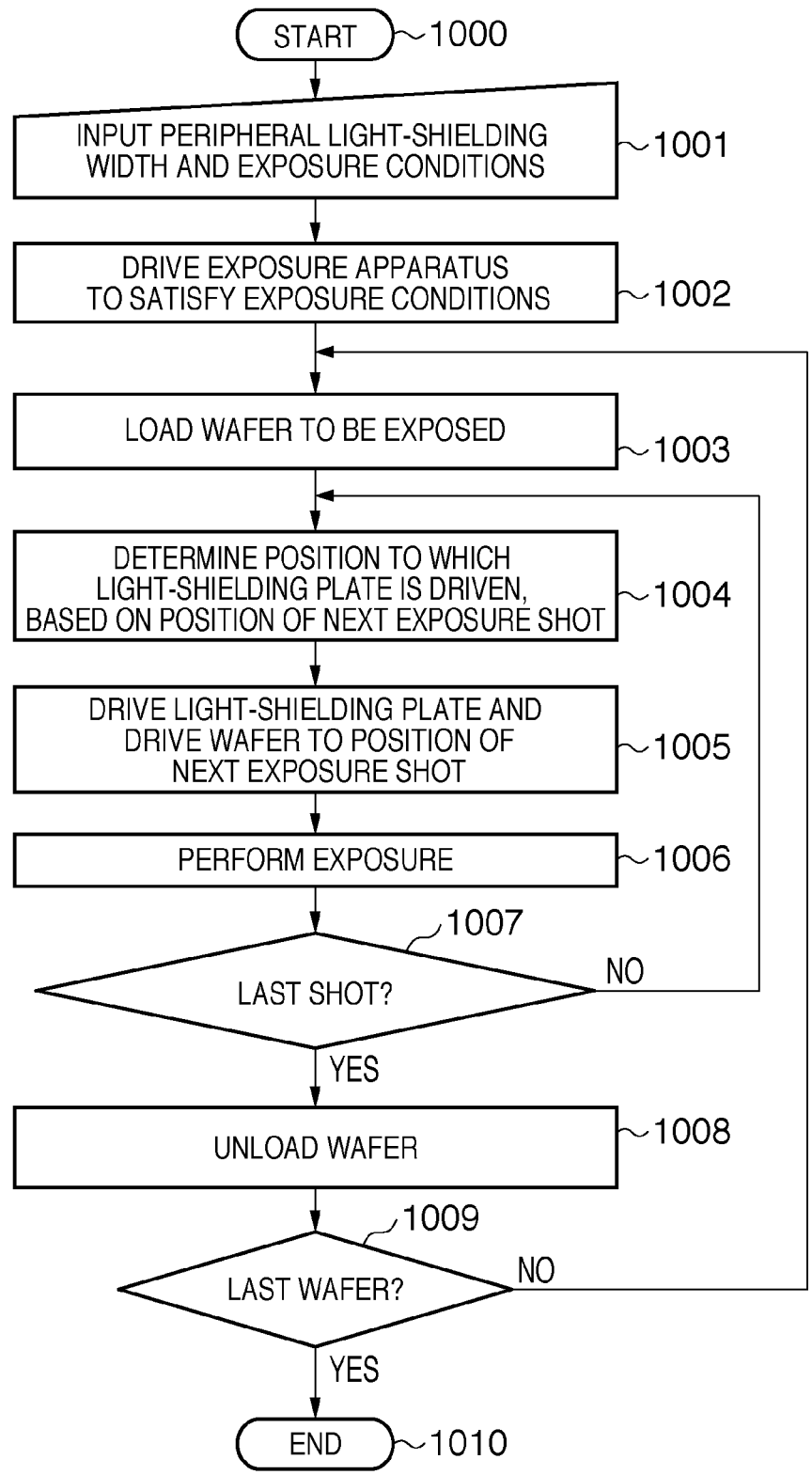

LITHOGRAPHIC APPARATUS AND METHOD OF MANUFACTURING ARTICLE

BACKGROUND OF THE INVENTION

1. Field of the Invention

The present invention relates to a lithographic apparatus and a method of manufacturing an article.

2. Description of the Related Art

In recent years, it is becoming more common that a semiconductor device is mounted by adopting flip-chip implementation. A process of manufacturing a semiconductor device that is mounted by using flip-chip implementation includes a process of forming a solder ball on a device. As one method of forming a solder ball, plating is available. To form a solder ball by plating, it is necessary to bring a conductive film formed on a wafer (also sometimes called a substrate) and the electrode of a plating device into contact with each other to electrically connect them to each other. To meet this requirement, Japanese Patent Publication No. 2-51254 proposes a method of peeling off a portion, to be brought into contact with the electrode, of a resist film formed on the conductive film. If the resist used is a negative resist, it is only necessary to prevent light on the wafer peripheral portion during exposure. To do this, U.S. Pat. No. 6,680,774 proposes a method of locating a light-shielding plate on the wafer.

Also, Japanese Patent Laid-Open No. 2005-286062 discloses an imprint apparatus which irradiates a resist on a wafer that is in contact with a mold with ultraviolet rays to transfer the pattern of the mold onto the resist. To define an irradiation region corresponding to each shot region in the wafer peripheral portion, the imprint apparatus disclosed in Japanese Patent Laid-Open No. 2005-286062 includes driving units which drive, in the x and y directions, four light-shielding plates having arcs corresponding to the contours of the wafer in the first to fourth quadrants, respectively.

However, the method of placing a light-shielding plate on the wafer, described in U.S. Pat. No. 6,680,774, generates dust as the light-shielding plate is loaded/unloaded, so dirt may adhere onto the wafer, leading to a defect of a semiconductor device. Also, the four light-shielding plates described in Japanese Patent Laid-Open No. 2005-286062 generate dust upon being driven at a position immediately above the wafer, and require a total of eight driving units for driving them in the x and y directions.

SUMMARY OF THE INVENTION

The present invention provides a lithographic apparatus which blocks light to prevent it from being incident on an outer peripheral region on a substrate with a simple structure without allowing dirt to adhere onto the substrate.

The present invention in its first aspect provides a lithographic apparatus which irradiates a photosensitive material coated on a substrate with light via an original by an irradiation system to transfer a pattern of the original onto a shot region on the substrate, the apparatus comprising: a light-shielding plate which includes, on an edge thereof, an arc overlapping with a circular boundary line that defines a region, onto which the pattern is transferred, on the substrate and is located inside an outer periphery of the substrate at a predetermined distance therefrom, and blocks the light to prevent the light from being incident on an outer peripheral region located outside the circular boundary line on the substrate; a first driving unit which rotates the light-shielding plate about an axis parallel to an optical axis of the irradiation system; and a second driving unit which linearly drives the light-shielding plate within a plane perpendicular to the optical axis of the irradiation system.

The present invention in its second aspect provides a lithographic apparatus which irradiates a photosensitive material coated on a substrate with light via an original by an irradiation system to transfer a pattern of the original onto a shot region on the substrate, the apparatus comprising: a light-shielding plate which includes, on an edge thereof, sides of a polygon overlapping with a circular boundary line that defines a region, onto which the pattern is transferred, on the substrate and is located inside an outer periphery of the substrate at a predetermined distance therefrom, and blocks the light to prevent the light from being incident on an outer peripheral region located outside the circular boundary line on the substrate; a first driving unit which rotates the light-shielding plate about an axis parallel to an optical axis of the irradiation system; and a second driving unit which linearly drives the light-shielding plate within a plane perpendicular to the optical axis of the irradiation system.

Further features of the present invention will become apparent from the following description of exemplary embodiments with reference to the attached drawings.

BRIEF DESCRIPTION OF THE DRAWINGS

FIG. 4 is a flowchart for explaining an exposure method according to the first embodiment;

DESCRIPTION OF THE EMBODIMENTS

First Embodiment

Figure 1:
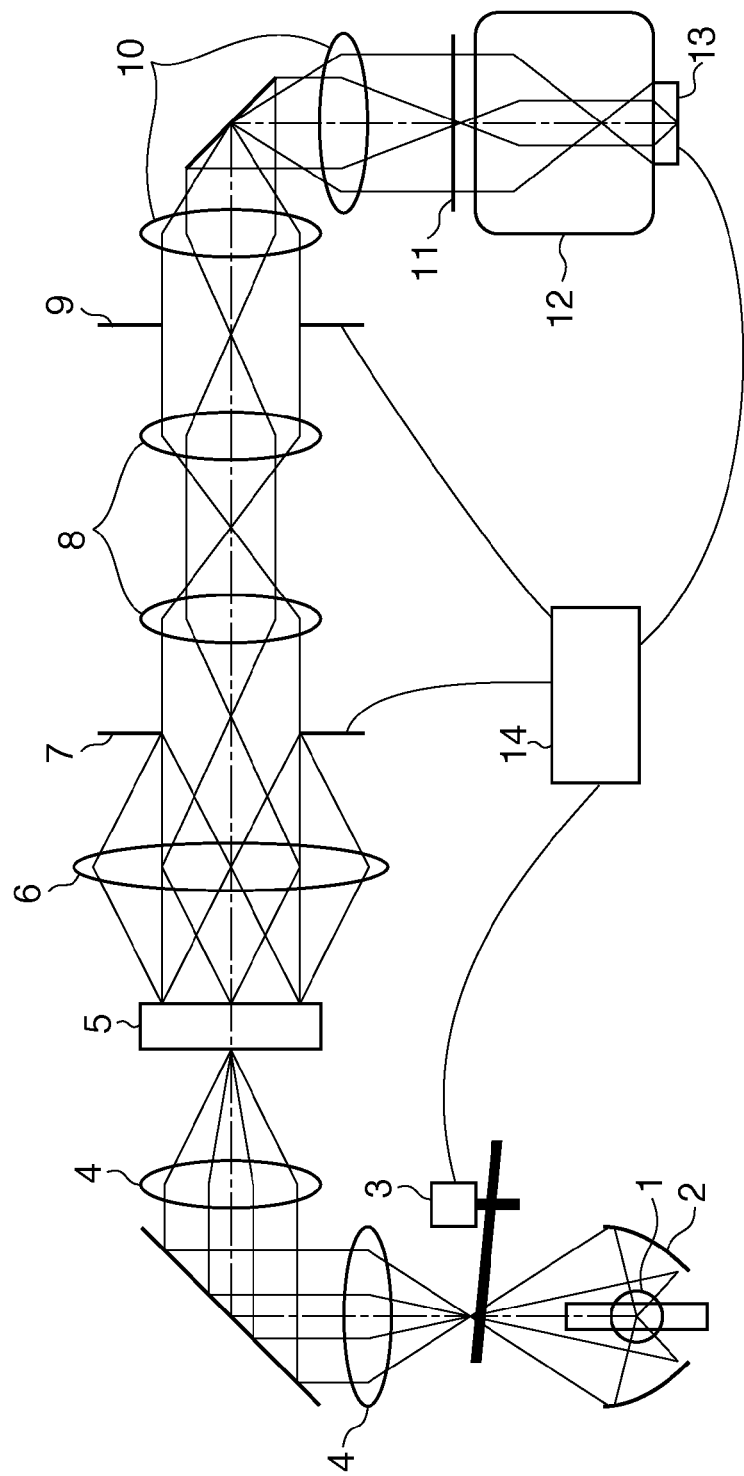
FIG. 1 is a view showing an exposure apparatus according to the first embodiment.

FIG. 1 shows a lithographic apparatus according to the first embodiment, which irradiates a photosensitive material coated on a substrate with light via an original by an irradiation system to transfer the pattern of the original onto a shot region on the substrate. In the first embodiment, an exposure apparatus which projects and transfers the pattern of an original onto a shot region by a projection optical system is used as a lithographic apparatus. Although FIG. 1 illustrates an example in which a super-high pressure mercury lamp is used as a light source 1, an excimer laser may be used. An elliptical mirror is typically used as a condensing mirror 2. Besides an elliptical mirror, a facet mirror optimized to enhance the degree of convergence at the point of convergence may be used. A shutter 3 undergoes opening/closing time adjustment to adjust the exposure amount on a substrate (wafer) 13 coated with a photosensitive material (photosensitive agent) (to be described later). In an exposure apparatus, the coherence factor (σ value) must be changed to optimize the imaging performance of a projection optical system in accordance with the pattern to be transferred. The σ value is [(NA of Illumination Optical System)/(NA of Projection Optical System)], and can be changed by changing the beam diameter on a fly-eye lens 5, which determines the NA (Numerical Aperture) of the illumination optical system. A scaling relay optical system 4 has a zoom mechanism and can change the beam diameter on the fly-eye lens 5. A cylindrical lens array may be used in place of the fly-eye lens 5. The fly-eye lens 5 splits the wavefront of the light beam on its incident surface to form a secondary light source on its exit surface. A condenser optical system 6 superposes the light beams, having undergone wavefront splitting by the fly-eye lens 5, on a surface to be illuminated. This makes it possible to attain a uniform illuminance distribution on the surface to be illuminated. A masking blade 7 is located on the surface to be illuminated of the condenser optical system 6. The masking blade 7 is a stop with a variable aperture, and determines the shape (shot shape) of one shot region onto which the exposure apparatus repeatedly transfers a pattern by the step-and-repeat method. That is, the masking blade 7 forms a second light-shielding plate which blocks the light to prevent it from being incident on a region located outside a linear side that defines the outer edge of a shot region. A relay optical system 8 projects the illuminance distribution formed at the position of the masking blade 7 onto a light-shielding plate 9. A relay optical system 10 projects the illuminance distribution formed at the position of the light-shielding plate 9 onto an original (reticle) 11. The above-mentioned members from the light source 1 to the relay optical system 10 constitute an irradiation system which irradiates the photosensitive material (photosensitive agent) coated on the substrate (wafer) 13 with light via the original (reticle) 11.

Figure 7:
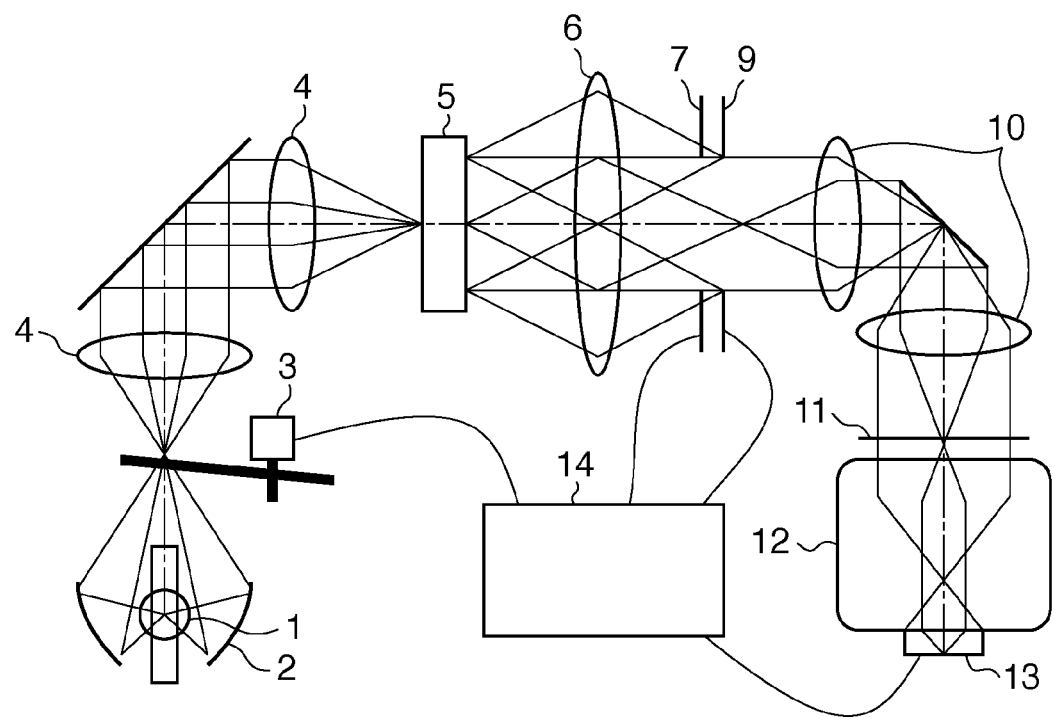
FIG. 7 is a view showing another example of the first embodiment.

The light-shielding plate 9 can change the shape of a region onto which the exposure apparatus transfers a pattern, in accordance with the exposure position on the wafer 13 when the exposure apparatus repeatedly exposes the wafer 13 by the step-and-repeat method. The light-shielding plate 9 includes, on its edge, an arc overlapping with a circular boundary line that defines the transfer region on the substrate and is located inside the outer periphery of the substrate at a predetermined distance from it, and blocks the light to prevent it from being incident on an outer peripheral region located outside the circular boundary line on the substrate. For the sake of convenience in terms of location, the first embodiment has presented an arrangement in which the masking blade 7 and light-shielding plate 9 are located at different optically conjugate positions within the irradiation system using the relay optical system 8. However, when there is no problem in terms of location, the masking blade 7 may be located to be adjacent to the light-shielding plate 9, as shown in FIG. 7. In locating the masking blade 7 to be adjacent to the light-shielding plate 9, if they do not fall within practically the same position, it is desirable to locate the light-shielding plate 9 at a position optically conjugate to the wafer 13 and locate the masking blade 7 at a defocused position. Also, if the amount of defocus falls outside the tolerance, the masking blade 7 blocks the light to prevent it from being incident on a region located outside a linear side that defines the outer edge of a shot region, which is parallel to a first direction. A light-shielding portion which blocks the light is provided on the reticle (original) 11 using a Cr pattern to prevent the light from being incident on a region located outside a linear side that defines the outer edge of the shot region, which is parallel to a second direction perpendicular to the first direction. Moreover, the shape of the shot region may be determined in accordance with the Cr pattern on the reticle 11, and the masking blade 7 may block the light using a region larger than the shape of the shot region in order to prevent transfer that accompanies a Cr defect on the reticle 11. The order in which the masking blade 7 and light-shielding plate 9 are located within the irradiation system is arbitrary, so either of them may be on the side of the light source 1.

The relay optical system 10 projects the illuminance distribution formed at the position of the light-shielding plate 9 onto the reticle 11. A circuit pattern to be transferred is drawn on the reticle (also sometimes called a mask) 11. A projection optical system 12 projects and images the pattern drawn on the reticle 11 on the wafer (also sometimes called a substrate) 13 coated with a photosensitive film (also sometimes called a resist). A controller (computer) 14 controls the exposure apparatus to expose the wafer 13.

Figure 2A:
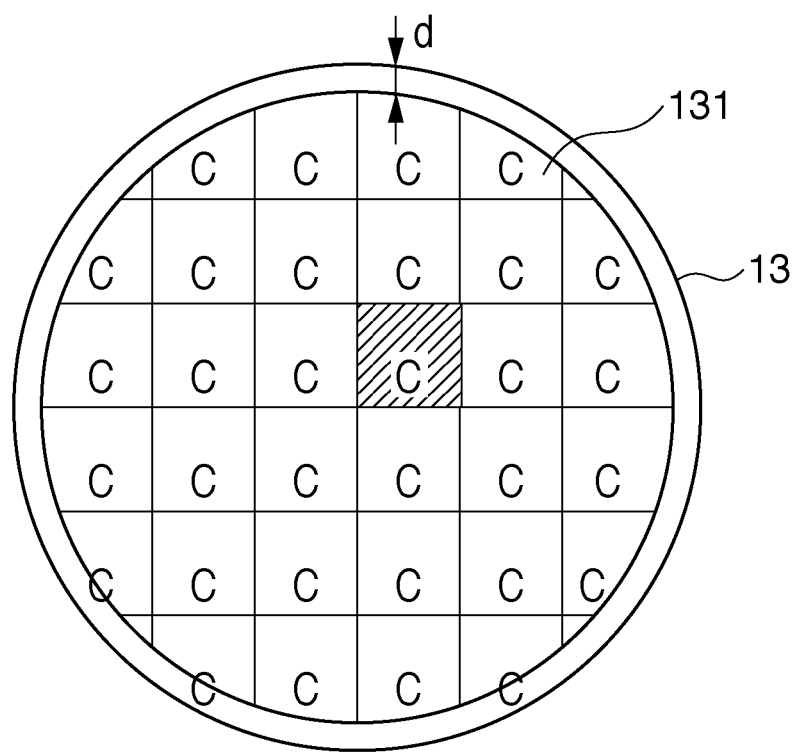
FIGS. 2A and 2B are views for explaining the transfer region on a substrate.
Figure 2B:
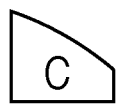

The light-shielding plate 9 will be described in more detail below. FIG. 2A is a view for explaining the transfer region on the wafer 13, when the wafer 13 is viewed from the direction going into the paper surface in FIG. 2A. Although a wafer made of silicon is typically used as the wafer 13, wafers made of glass, sapphire, or a compound are also often used. A region, onto which the exposure apparatus can transfer a pattern by one transfer operation, is determined in accordance with the imaging region of the projection optical system 12, and is generally smaller than the size of the wafer 13. Hence, a method which is called the step-and-repeat scheme and repeats transfer while moving the wafer 13 step by step is used in that case. A region indicated by hatched lines in FIG. 2A represents a shot region onto which a pattern is transferred by one transfer operation. By repeatedly transferring a pattern onto such shot regions while shifting the wafer 13, identical patterns indicated by "C" can be repeatedly transferred as a whole. As has been described in relation to the background arts, a region in which the resist must be peeled off is present on the wafer 13 in order to bring it into contact with the electrode in a plating process. This region is an outer peripheral region with a width d in the peripheral portion of the wafer 13 in FIG. 2A. This outer peripheral region must be shielded against light during exposure if the resist coated on the wafer 13 is a negative resist. That is, a pattern must be transferred within an exposure range as shown in FIG. 2B for a transfer region denoted by reference numeral 131 in FIG. 2A.

Figure 3A:
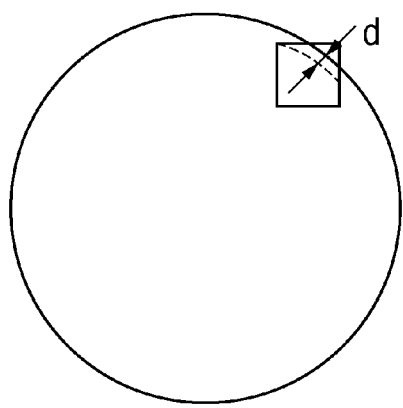
FIGS. 3A to 3D are views for explaining a light-shielding plate according to the first embodiment.
Figure 3B:
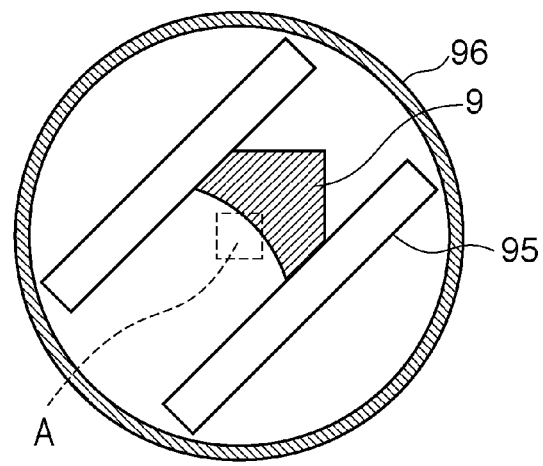

FIG. 3B shows the light-shielding plate 9 according to the first embodiment for allowing exposure of a transfer region as mentioned above. FIG. 3B is a view showing the light-shielding plate 9 when viewed from the lateral direction on the paper surface in FIG. 1. A region surrounded by a dotted line indicated by reference symbol A in FIG. 3B represents the shape of a shot region on the light-shielding plate 9, and the light-shielding plate 9 shields it against light so as to form this shape. The light-shielding plate 9 includes at least one arc on its edge. The radius of the arc is desirably equal to the value obtained by subtracting the light-shielding width d of the outer peripheral region from the radius of the wafer 13 upon projection onto the wafer 13 by the projection optical system 12. Although an arc is desirably used, a straight line may be used if a polygon is usable as the shape of the light-shielding region on the periphery of the wafer 13. A driving unit 96 is a first driving unit which rotates the light-shielding plate 9 about an axis parallel to the optical axis of the irradiation system. A driving unit 95 is a second driving unit which linearly drives the light-shielding plate 9 in the radial direction within a plane perpendicular to the optical axis of the irradiation system. In the example shown in FIG. 3B, by mounting the driving unit 95 on the driving unit 96, the light-shielding plate 9 can be driven in both the radial and rotational directions upon defining the optical axis as the center. Note that another embodiment may be adopted as long as the light-shielding plate 9 can be driven in both the radial and rotational directions upon defining the optical axis as the center.

Figure 3C:
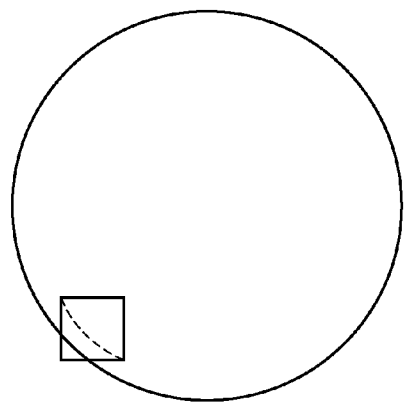
Figure 3D:
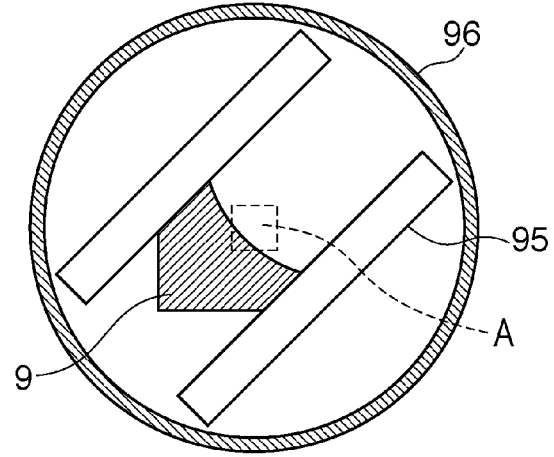

The controller (computer) 14 controls the driving unit 96 (first driving unit) and the driving unit 95 (second driving unit) so that the light-shielding plate 9 is positioned at a position, at which it covers the outer peripheral region which is in contact with a shot region onto which a pattern is to be transferred, when the shot region is in contact with the outer peripheral region. For example, to irradiate the upper right region on the wafer 13, as shown in FIG. 3A, the light-shielding plate 9 is positioned to cover the region A, as shown in FIG. 3B. Thus, the light-shielding plate 9 eclipses the shot region shown in FIG. 3A at the position indicated by the dotted line, thereby making it possible to produce a non-exposure region in the peripheral portion of the wafer 13. To irradiate the lower left region on the wafer 13, as shown in FIG. 3C, the light-shielding plate 9 is positioned to cover the region A, as shown in FIG. 3D. Thus, the light-shielding plate 9 eclipses the shot region shown in FIG. 3C at the position indicated by the dotted line, thereby making it possible to produce a non-exposure region in the peripheral portion of the wafer 13.

An exposure method according to the first embodiment will be described with reference to a flowchart shown in FIG. 4. In step 1001, the peripheral light-shielding width and the exposure conditions such as the σ value, the shot shape, and the shot layout are input to the computer 14 which controls the exposure apparatus. In step 1002, the computer 14 drives the scaling relay optical system 4 to a predetermined position based on the input σ information, and drives the masking blade 7 based on the input, repeated transfer region information. Other constituent elements (not shown) of the exposure apparatus are also driven to assume a specific state based on the exposure conditions. In step 1003, a wafer 13 to be exposed is loaded. In step 1004, the computer 14 determines the position to which the light-shielding plate 9 is driven, based on the input peripheral light-shielding width and the position of the next exposure shot on the wafer 13. In step 1005, the computer 14 drives a stage which holds the wafer 13 to move the next exposure shot to the transfer region of the projection optical system 12, and drives the light-shielding plate 9 to a predetermined position. In step 1006, the computer 14 controls driving of the shutter 3 to irradiate the wafer 13 at a predetermined exposure amount. Thus, the pattern of the reticle 11 is reduced or enlarged and transferred onto the photosensitive agent on the wafer 13. In step 1007, the computer 14 determines whether all shot regions on the wafer 13 have been repeatedly exposed. If a shot region to be exposed remains, the process returns to step 1004, in which exposure of the next shot is started. If all shot regions have been exposed, the exposure process of the wafer 13 ends, and the wafer 13 is unloaded in step 1008. In step 1009, the computer 14 determines whether all wafers 13 have been exposed. If a wafer 13 to be exposed remains, an exposure process of the next wafer 13 is started. If all wafers 13 have been exposed, the exposure processes end.

Figure 5A:
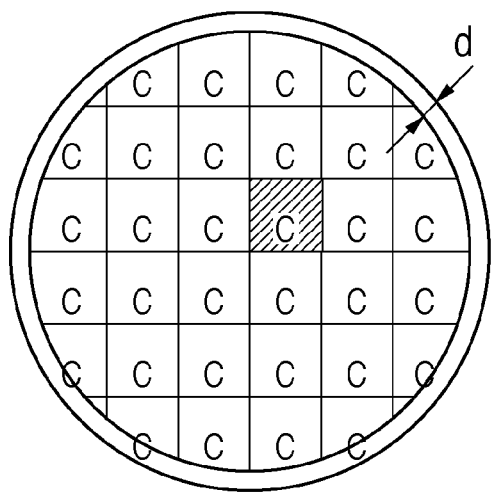
FIGS. 5A and 5B are views for explaining a method of changing the light-shielding width.
Figure 5B:
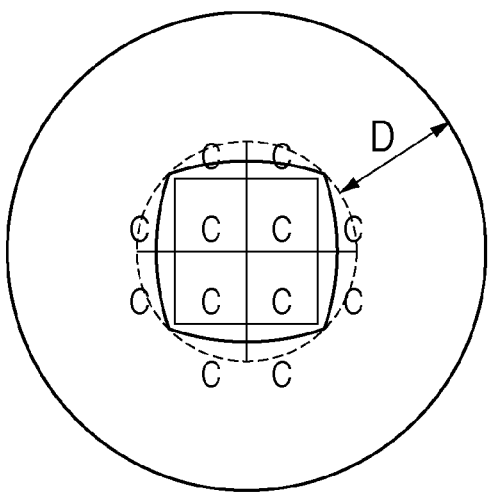

The light-shielding width of the periphery of the wafer 13 can be changed by appropriately setting the input. For example, when a light-shielding plate 9 having an arc optimized at a light-shielding width d, as shown in FIG. 5A, is provided, and a different width D, as shown in FIG. 5B, is input, the light can be blocked in an almost circular shape using its arc. Although an example in which the light-shielding width extremely changes has been described with reference to FIG. 5, the light-shielding width changes only within the range of 1 mm to 5 mm in practice when the wafer 13 has a diameter of 300 mm. Hence, the light can be blocked in a shape sufficiently close to a circle as long as an arc shape optimized for a light-shielding width of 3 mm is used.

Second Embodiment

Figure 6:
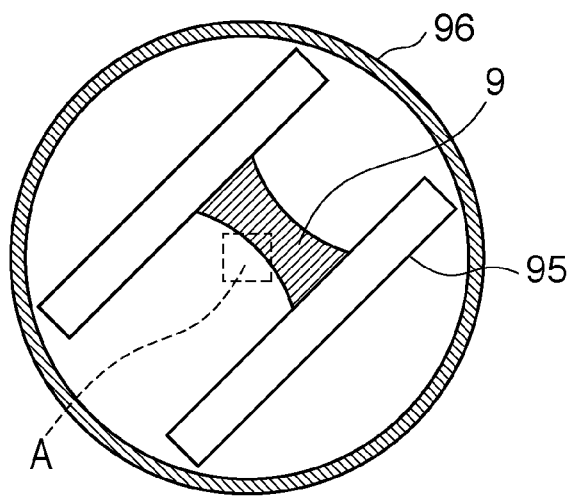
FIG. 6 is a view for explaining a light-shielding plate according to the second embodiment.

The second embodiment will be described with reference to FIG. 6. A light-shielding plate 9 according to the second embodiment includes two arcs: a first arc and second arc which are located at opposite positions on the edge of the light-shielding plate 9 and concavely curved in the directions from the inner side of the light-shielding plate 9 to its outer side, as shown in FIG. 6. Thus, a driving unit 96 need only rotate the light-shielding plate 9 through a maximum of 180°. In the first embodiment, since the outer peripheral region on the wafer 13 is shielded against light using only one arc, the driving unit 96 requires a rotational range of 360°. However, in the second embodiment, since two arcs take part in light blocking, the rotational range of the driving unit 96 can be narrowed to 180° by, for example, using different arcs as an arc which shields the outer peripheral region on a wafer 13 in the first and fourth quadrants against light and that which shields the outer peripheral region on the wafer 13 in the second and third quadrants against light. This makes it possible to shorten the driving time until a light blocking state is set and to reduce the cost of a driving device including a driving unit 95 and the driving unit 96. Because the distance between the two arcs and their shapes are expected to change due to processing errors, an offset in driving is desirably set for each arc. Also, although two arcs are adopted in the second embodiment, three or more arcs may be adopted. The outer peripheral region in the first and second quadrants may be shielded against light using the first arc and that in the third and fourth quadrants may be shielded against light using the second arc, and the range assigned to each arc within 360° depends on the degree of design freedom. The rotational range in terms of design may be set assuming that the driving unit 96 moves by 180° or more.

Third Embodiment

Figure 8:
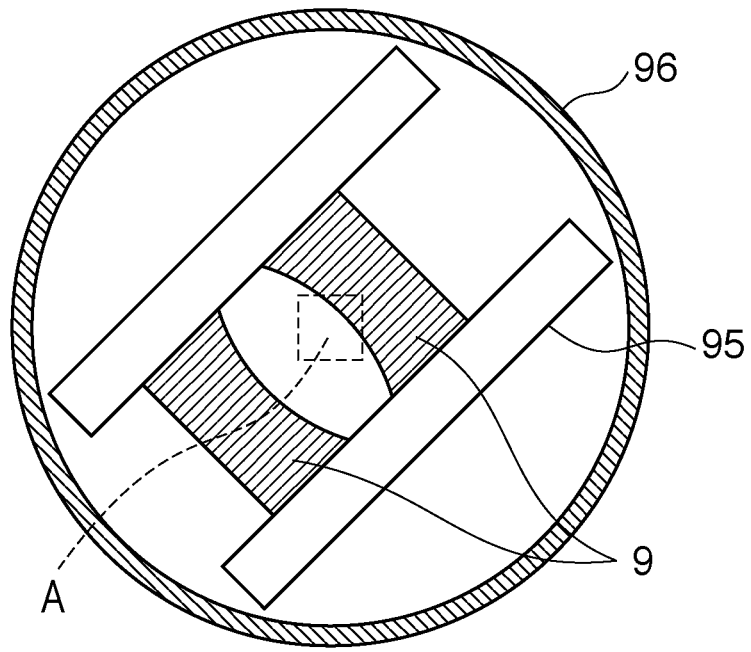
FIG. 8 is a view for explaining a light-shielding plate according to the third embodiment.
Figure 9:
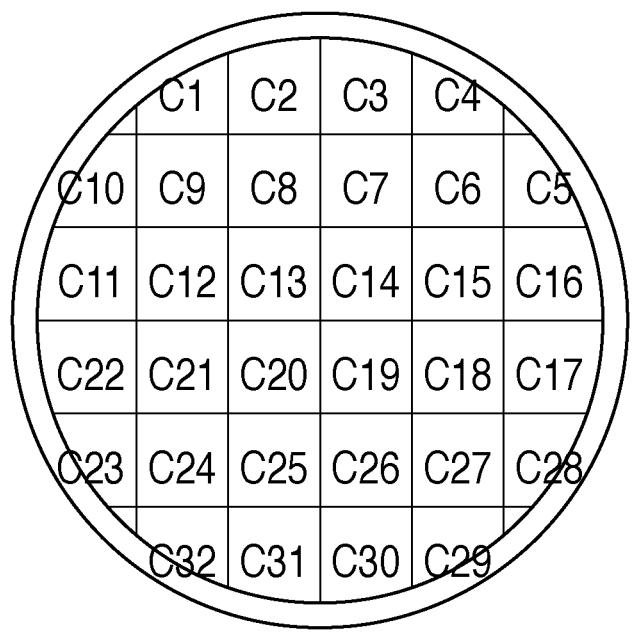
FIG. 9 is a view for explaining the superiority of the third embodiment.

The third embodiment will be described with reference to FIG. 8. A light-shielding plate 9 according to the third embodiment has an aperture and includes a first arc and second arc which are located at opposite positions on the edge of the aperture, and the first arc and second arc are convexly curved in the directions from the inner side of the aperture to its outer side, as shown in FIG. 8. In the second embodiment, because two arcs are formed in the front and back portions of one light-shielding plate 9, the light-shielding plate 9 needs to cross the exposure region when one end of the shot region is shielded against light and its other end is shielded against light next. However, in the third embodiment, because the two arcs are opposed through the aperture, the light-shielding plate 9 need not cross the exposure region. Details of this difference will be explained by taking as an example a case in which, for example, a wafer 13 is exposed in turn from a shot region C1 to a shot region C32, as shown in FIG. 9. The outer peripheral region in the second quadrant must be shielded against light in the shot region C2, and that in the first quadrant must be shielded against light in the shot region C3. Therefore, in the second embodiment, to expose the shot region C3 after exposure of the shot region C2, the light-shielding plate 9 needs to cross the exposure region, and exposure cannot be performed during crossing, thus decreasing the number of wafers processed per unit time. However, in the third embodiment, no such problem is posed, so the outer peripheral region on the wafer 13 can be shielded against light without decreasing the number of wafers processed per unit time. Also, the arc for light blocking must be switched from one to the other before the shot region C10 is exposed after exposure of the shot region C5. In the second embodiment, exposure must be stopped to interchange the arcs. However, in the third embodiment, driving for interchanging the arcs can be performed while the shot regions C6 to C9 are exposed, so the outer peripheral region on the wafer 13 can be shielded against light without decreasing the number of wafers processed per unit time. Because the distance between the two arcs and their shapes are expected to change due to processing errors, an offset in driving is desirably set for each arc.

In the first to third embodiments, an exposure apparatus which projects and transfers the pattern of an original onto a shot region on a substrate by a projection optical system is used as a lithographic apparatus. However, an imprint apparatus which performs an imprint process of pressing an original(mold) against a photosensitive material, and irradiating the photosensitive material with light by an irradiation system via the original, thereby curing the photosensitive material may be used as a lithographic apparatus.

[Method of Manufacturing Article]

A method of manufacturing a device (for example, a semiconductor integrated circuit device or a liquid crystal display device) as an article includes a step of transferring (forming) a pattern onto a substrate (a wafer, a glass plate, or a film-like substrate) using the above-mentioned lithographic apparatus. The manufacturing method can also include a step of etching the substrate onto which the pattern is transferred. Note that when other articles such as a patterned medium (recording medium) or an optical element are to be manufactured, the manufacturing method can include other processes of processing the substrate onto which the pattern is transferred, in place of etching. Although the first to third embodiments have been described above, the present invention is not limited to these embodiments, and various modifications and changes can be made without departing from its scope.

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2010-104232 filed Apr. 28, 2010, which is hereby incorporated by reference herein in its entirety.

What is claimed is:

1. A lithographic apparatus which irradiates a photosensitive material coated on a substrate with light via an original by an irradiation system to transfer a pattern of the original onto a shot region on the substrate, the apparatus comprising:
   a light-shielding plate which includes, on an edge thereof, an arc overlapping with a circular boundary line that defines a region, onto which the pattern is transferred, on the substrate and is located inside an outer periphery of the substrate at a predetermined distance therefrom, and blocks the light to prevent the light from being incident on an outer peripheral region located outside the circular boundary line on the substrate;
   a first driving unit which rotates said light-shielding plate about an axis parallel to an optical axis of the irradiation system;
   a second driving unit which linearly drives said light-shielding plate in a direction determined depending on rotation of said light-shielding plate within a plane perpendicular to the optical axis of the irradiation system; and
   a controller which controls said first driving unit and said second driving unit so that said light-shielding plate is positioned at a position, at which said light-shielding plate covers the outer peripheral region which is in contact with a shot region onto which the pattern is to be transferred, when the shot region is in contact with the outer peripheral region,
   wherein the arc includes a first arc and a second arc which are located on edges of the light-shielding plate,
   wherein the minimum width, in the direction in which said second driving unit linearly drives said light-shielding plate, of said light-shielding plate is longer than a length of a diagonal line of the shot region, and
   wherein said controller controls said first driving unit and said second driving unit so as to use one of the first arc and the second arc in accordance with a position of the shot region which is in contact with the outer peripheral region.

2. The apparatus according to claim 1, wherein the arc includes a first arc and a second arc which are located at opposite positions on the edge of said light-shielding plate, and the first arc and the second arc are concavely curved in directions from an inner side of said light-shielding plate to an outer side thereof.

3. The apparatus according to claim 1, wherein said light-shielding plate includes an aperture, and the first arc and the second arc are located at opposite positions on an edge of the aperture, and the first arc and the second arc are convexly curved in directions from an inner side of the aperture to an outer side thereof.

4. The apparatus according to claim 1, wherein said light-shielding plate is located at a position conjugate to the substrate within the irradiation system.

5. The apparatus according to claim 4, further comprising
   a second light-shielding plate which blocks the light to prevent the light from being incident on a region located outside a linear side that defines an outer edge of a shot region,
   wherein said second light-shielding plate is located at a position which is conjugate to the substrate and is different from the position at which said light-shielding plate is located within the irradiation system.

6. The apparatus according to claim 4, further comprising
   a second light-shielding plate which blocks the light to prevent the light from being incident on a region located outside a linear side that defines an outer edge of a shot region,
   wherein said second light-shielding plate is located to be adjacent to said light-shielding plate.

7. The apparatus according to claim 4, further comprising
   a second light-shielding plate which blocks the light to prevent the light from being incident on a region located outside a linear side that defines an outer edge of a shot region, which is parallel to a first direction,
   wherein said second light-shielding plate is located to be adjacent to said light-shielding plate, and
   the original includes a light-shielding portion which blocks the light to prevent the light from being incident on a region located outside a linear side that defines an outer edge of the shot region, which is parallel to a second direction perpendicular to the first direction.

8. The apparatus according to claim 1, wherein the lithographic apparatus includes an exposure apparatus which projects and transfers a pattern of the original onto the shot region by a projection optical system.

9. The apparatus according to claim 1, wherein the arc of the light-shielding plate includes a polygon.

10. A method of manufacturing an article, the method comprising:

forming a pattern on a substrate using a lithographic apparatus which irradiates a photosensitive material coated on the substrate with light via an original by an irradiation system to transfer a pattern of the original onto a shot region on the substrate; and processing the substrate on which the pattern is formed in the forming, wherein the lithographic apparatus includes a light-shielding plate which includes, on an edge thereof, an arc overlapping with a circular boundary line that defines a region, onto which the pattern is transferred, on the substrate and is located inside an outer periphery of the substrate at a predetermined distance therefrom, and blocks the light to prevent the light from being incident on an outer peripheral region located outside the circular boundary line on the substrate, a first driving unit which rotates the light-shielding plate about an axis parallel to an optical axis of the irradiation system, a second driving unit which linearly drives said light-shielding plate in a direction determined depending on rotation of said light-shielding plate within a plane perpendicular to the optical axis of the irradiation system; and a controller which controls said first driving unit and said second driving unit so that said light-shielding plate is positioned at a position, at which said light-shielding plate covers the outer peripheral region which is in contact with a shot region onto which the pattern is to be transferred, when the shot region is in contact with the outer peripheral region wherein the arc includes a first arc and a second arc which are located on edges of the light-shielding plate, wherein the minimum width, in the direction in which said second driving unit linearly drives said light-shielding plate, of said light-shielding plate is longer than a length of a diagonal line of the shot region, and wherein said controller controls said first driving unit and said second driving unit so as to use one of the first arc and the second arc in accordance with a position of the shot region which is in contact with the outer peripheral region.

11. A lithographic apparatus which irradiates a photosensitive material coated on a substrate with light via a mold by an irradiation system to transfer a pattern of the mold onto a shot region on the substrate, the apparatus comprising:

a light-shielding plate which includes, on an edge thereof, an arc overlapping with a circular boundary line that defines a region, onto which the pattern is transferred, on the substrate and is located inside an outer periphery of the substrate at a predetermined distance therefrom, and blocks the light to prevent the light from being incident on an outer peripheral region located outside the circular boundary line on the substrate;

a first driving unit which rotates said light-shielding plate about an axis parallel to an optical axis of the irradiation system;

a second driving unit which linearly drives said light-shielding plate in a direction determined depending on rotation of said light-shielding plate within a plane perpendicular to the optical axis of the irradiation system; and a controller which controls said first driving unit and said second driving unit so that said light-shielding plate is positioned at a position, at which said light-shielding plate covers the outer peripheral region which is in contact with a shot region onto which the pattern is to be transferred, when the shot region is in contact with the outer peripheral region, wherein the arc includes a first arc and a second arc which are located on edges of the light-shielding plate, wherein the minimum width, in the direction in which said second driving unit linearly drives said light-shielding plate, of said light-shielding plate is longer than a length of a diagonal line of the shot region, and wherein said controller controls said first driving unit and said second driving unit so as to use one of the first arc and the second arc in accordance with a position of the shot region which is in contact with the outer peripheral region.

* * * * *